(12) United States Patent
Yamazaki et al.

(10) Patent No.: US 6,181,007 B1
(45) Date of Patent: Jan. 30, 2001

(54) SEMICONDUCTOR DEVICE

(75) Inventors: Kazuaki Yamazaki, Kanagawa; Yoshikazu Takahashi, Nagano, both of (JP)

(73) Assignee: Fuji Electric Co., Ltd. (JP)

( * ) Notice: Under 35 U.S.C. 154(b), the term of this patent shall be extended for 0 days.

(21) Appl. No.: 09/324,318

(22) Filed: Jun. 2, 1999

(30) Foreign Application Priority Data

Jun. 2, 1998 (JP) .................................................. 10-152420

(51) Int. Cl.$^7$ .................................................. H01L 23/34
(52) U.S. Cl. ........................ 257/718; 257/720; 257/727
(58) Field of Search .................................. 257/718, 719, 257/720, 726, 727

(56) References Cited

U.S. PATENT DOCUMENTS

| | | | |
|---|---|---|---|
| 5,043,795 | * 8/1991 | Takahashi et al. | 257/182 |
| 5,610,439 | * 3/1997 | Hiyoshi et al. | 257/688 |
| 5,635,427 | * 6/1997 | Takahashi | 438/107 |
| 5,726,466 | 3/1998 | Nishitani | 257/181 |
| 5,866,944 | * 2/1999 | Hiyoshi et al. | 257/719 |
| 5,874,774 | 2/1999 | Takahashi | 257/688 |

FOREIGN PATENT DOCUMENTS

| | | |
|---|---|---|
| 0 645 816 A1 | 3/1995 | (EP) . |
| 0 702 406 A2 | 3/1996 | (EP) . |
| 0 746 023 A2 | 12/1996 | (EP) . |
| 09275186 | 10/1997 | (JP) . |

* cited by examiner

*Primary Examiner*—Kenneth B. Wells
*Assistant Examiner*—Quan Tra
(74) *Attorney, Agent, or Firm*—Rossi & Associates

(57) ABSTRACT

A semiconductor device is provided which includes a plurality of semiconductor units each including a semiconductor chip, a support plate, a contact terminal block and a positioning guide, a flat package including a pair of common electrode plates and an insulating outer sleeve, and positioning and thermal-stress reducing means for positioning the support plates of the semiconductor elements in a horizontal direction, without interfering with the positioning guides, and reducing a thermal stress applied to a peripheral portion of a contact interface between the contact terminal block and the semiconductor chip due to heat generated during intermittent flow of current through a load. The contact terminal block is disposed on a first main electrode of the semiconductor chip, while the support plate is secured to a second main electrode of the chip, such that the semiconductor chip is placed under pressure between the contact terminal block and support plate that also serve as conductors and heat radiators. The semiconductor units are incorporated in the flat package, such that the pair of common electrode plates are in pressure contact with the contact terminal blocks and the support plates, respectively, of all of the semiconductor units.

13 Claims, 4 Drawing Sheets

SEMICONDUCTOR DEVICE

FIELD OF THE INVENTION

The present invention relates to a semiconductor device, and in particular to a pressure contact type semiconductor device in which a plurality of insulated gate bipolar transistors (IGBT) are incorporated in the same flat package.

BACKGROUND OF THE INVENTION

Insulated gate bipolar transistors (IGBT) have been widely used as power switching devices in such applications, for example, as motor PWM (pulse width modulation) control inverters. The IGBT is a voltage driven type device, which is easy to handle as compared with a current driven type device, and therefore there has been a strong demand in the market for an increase in the current capacity of the IGBT. To meet with the demand of the market, a modular structure has been employed in which a plurality of IGBT chips are integrated together within the same package. In a MOS control type device, such as an IGBT, an emitter electrode and a gate electrode are located side by side on the main surface of a semiconductor chip. In general, when such IGBT chips are incorporated or mounted in a package or case, a collector electrode formed on the lower surface of each chip is soldered to a support plate as a metallic base that also serves as a heat radiator, and connected to an external conductor, while the emitter electrode and gate electrode are separately connected to external lead terminals through bonding wires, or the like. The bonding wires consist of aluminum lead wires having a diameter of about 300 μm, and therefore heat dissipation mainly takes place at one surface on which the collector electrode is formed, thus resulting in reduced efficiency and reduced operating reliability.

In view of the above situation, there has been proposed a pressure contact type IGBT in which a plurality of IGBT chips for achieving a larger current capacity are mounted in a flat package having an insulating outer sleeve made of a ceramic material, in a similar manner to conventional thyristors or GTO (gate turn-off) thyristors.

Here, a known IGBT having a flat structure as proposed in Japanese Patent Application No. 8-79743 will be described.

FIG. 4 shows a cross section of a principal part of the known IGBT having a flat structure. In FIG. 4, a plurality of IGBT chips 102 are mounted in a single package 101. Each IGBT chip 102 has an emitter contact terminal block 104 made of molybdenum, which block is accurately positioned by a positioning guide 103 having an insulating property. The emitter contact terminal blocks 104 of the respective IGBT chips 102 are in contact with a single thermal buffer plate 105 also made of molybdenum, and the buffer plate 105 is in contact with an upper common electrode plate 106 made of copper. The collector sides of the IGBT chips 102 are soldered to a single collector substrate 107 made of molybdenum, and the collector substrate 107 is in contact with a lower common electrode plate 108 made of copper. The upper common electrode plate 106 and the lower common electrode plate 108 are secured to an insulating sleeve 109 made of a ceramic material, to thus provide a package 101. A pressure contact type semiconductor device having desired current-carrying characteristics is fabricated by applying a pressure from the upper and lower sides of the upper common electrode plate 106 and lower common electrode plate 108, respectively, to the whole assembly of the thermal buffer plate 105, emitter contact terminal blocks 104, IGBT chips 102, and the collector substrate 107.

The pressure contact type semiconductor device having the flat structure as described above exhibits excellent electric conductivity and thermal conductivity due to the use of copper for the upper common electrode plate 106 and lower common electrode plate 108. Also, the emitter contact terminal blocks 104 and collector substrate 107 are made of molybdenum whose coefficient of thermal expansion is close to that of silicon, and therefore thermal stresses applied to the IGBT chips 102 can be desirably alleviated or reduced. Furthermore, the thermal buffer plate 105 that is made of hard molybdenum and inserted between the emitter contact terminal blocks 104 and the upper common electrode plate 106 can suppress or reduce extraordinary strains, which would otherwise arise in the IGBT chips 102 when the emitter contact terminal blocks 104 bite into and are pulled by the upper common electrode plate 106 having a large coefficient of thermal expansion during heat cycles. Thus, the pressure contact type IGBT has a high resistance to power cycles (in which current intermittently flows through a load), which is five times or more as high as that of the bonding-type modular structure.

The above type of IGBT is constructed such that a plurality of IGBT chips are secured to the single collector substrate 107. Where at least one defective IGBT chip is present among the IGBT chips mounted in the package, the whole IGBT becomes a defective, resulting in a reduced yield in the manufacture of IGBT. In order to improve the manufacturing yield, another type of IGBT having a flat structure as disclosed in Japanese Patent Application No. 7-328462 has been proposed.

FIG. 5 shows a cross section of a principal part of the IGBT as disclosed in the above-identified application. As shown in FIG. 5, each IGBT chip 111 is soldered to a collector substrate 112 to provide a semiconductor element. The semiconductor element and an emitter contact terminal block 114 are fitted in a positioning guide 113, so as to provide a single semiconductor unit. A plurality of such semiconductor units are arranged in contact with each other within a frame 115, and an upper common electrode plate 116 and a lower common electrode plate 117 are disposed on the upper and lower surfaces of the semiconductor units. Also, outer peripheral portions of the upper and lower common electrode plates 116, 117 are closed by an insulating outer sleeve 118, to thus provide a single IGBT.

Where at least one defective is present among the plural semiconductor units arranged in the above manner, the defective semiconductor unit may be easily replaced by a non-defective one, so as to provide a non-defective IGBT. This leads to an improved yield in the manufacture of IGBT, and reduced manufacturing cost.

The flat type IGBT having the known structure as shown in FIG. 4, however, suffers from a problem that the IGBT chips are broken in a power cycle test. More specifically, the coefficient of thermal expansion of the upper and lower common electrode plates having large areas is different from the coefficient of thermal expansion of the collector substrate similarly having a large area, and the emitter contact terminal block makes a seesaw motion on the surface of the corresponding IGBT chip, due to the difference in the coefficients of thermal expansion, thus causing a thermal stress at the interface between the emitter contact terminal block and the IGBT chip. In particular, the thermal stress is concentrated at the surface of the IGBT chip in the vicinity of the outer periphery or edge of the emitter contact terminal block, with the result of breakage of the IGBT chip. While the thermal stress is more or less suppressed by the thermal buffer plate between the emitter contact terminal blocks and the upper common electrode plate, the IGBT chips located in the peripheral portion of the device are particularly subjected to large thermal stresses, which cause a reduction in the service life of the IGBT.

In the IGBT as shown in FIG. 5, on the other hand, the collector substrate that contacts with the lower common electrode plate is provided for each semiconductor unit, and this structure, which is advantageous in terms of an improved yield in the manufacture of IGBT, provides a secondary effect of reducing thermal stresses and improving the resistance to power cycles. Where the semiconductor units are assembled together at room temperature, the positioning guides 113 of the respective semiconductor units are fitted in the frame 115 such that the guides 113 are in contact with each other, and thus positioned by themselves in horizontal directions. If the coefficient of thermal expansion of the positioning guides 113 is different from that of the upper and lower common electrode plates, the positioning guide of a certain semiconductor unit pushes the positioning guides of its adjacent semiconductor units in horizontal directions, whereby stresses are applied to the corresponding IGBT chips through the emitter contact terminal blocks, which may result in breakage of the IGBT chips.

SUMMARY OF THE INVENTION

The present invention was developed in the light of the above-described situations. It is therefore an object of the present invention to provide a semiconductor device including a plurality of semiconductor elements that are arranged side by side, wherein thermal stresses applied from common electrode plates are advantageously reduced, and the semiconductor elements can be positioned in horizontal directions without contacting with each other.

To accomplish the above object, the present invention provides a semiconductor device comprising a plurality of semiconductor units, a flat package, and positioning and thermal-stress reducing means. Each of the semiconductor units includes a semiconductor element, a contact terminal block, and a positioning guide, and the semiconductor element includes a semiconductor chip and a support plate. The semiconductor chip includes a first main electrode and a control electrode disposed on a first main surface thereof, and a second main electrode disposed on a second main surface thereof. The support plate is secured to a surface of the second main electrode for applying a pressure to the semiconductor chip and serving as a conductor and a heat radiator, and the contact terminal block is disposed on a surface of the first main electrode of the semiconductor chip, for applying a pressure to the semiconductor chip and serving as a conductor and a heat radiator. The positioning guide serves to position the support plate and the contact terminal block on the surface of the first main electrode. The flat package comprises first and second common electrode plates and an insulating outer sleeve that surrounds the first and second common electrode plates, and incorporates therein the semiconductor units that are arranged side by side. The first and second common electrode plates are in pressure contact with the contact terminal blocks and the support plates, respectively, of all of the semiconductor units. The positioning and thermal-stress reducing means is provided for positioning the support plates of the semiconductor elements in a horizontal direction, without interfering with the positioning guides, and reducing a thermal stress applied to a peripheral portion of a contact interface between the contact terminal block and the semiconductor chip due to heat generated during intermittent flow of current through a load.

In the semiconductor device constructed as described above, the semiconductor elements are positioned by the positioning and thermal-stress reducing means such that these elements are spaced from each other, and therefore the semiconductor elements do not interfere with each other even when the temperature changes cyclically in a power cycle test, for example. With this arrangement, the semiconductor elements are prevented from being pressed by adjacent semiconductor elements, and thus thermal stresses applied from the common electrode plates can be suppressed or reduced. Since the individual chips are allowed to move in accordance with thermal expansion of common electrodes even upon cyclic changes in the temperature in a power cycle test, it is possible to prevent large thermal stresses from being applied from the common electrode plates to the semiconductor chips, particularly those located in the peripheral part of the device. Thus, the present invention provide a pressure contact type semiconductor device having a high resistance to power cycles, and a high operating reliability.

BRIEF DESCRIPTION OF THE DRAWINGS

The present invention will be described in greater detail with reference to preferred embodiments thereof and the accompanying drawings, wherein.

DETAILED DESCRIPTION OF THE PREFERRED EMBODIMENTS

Some preferred embodiments of the present invention, when applied to pressure contact type IGBT having a flat structure, will be described in detail.

Figure 1A:
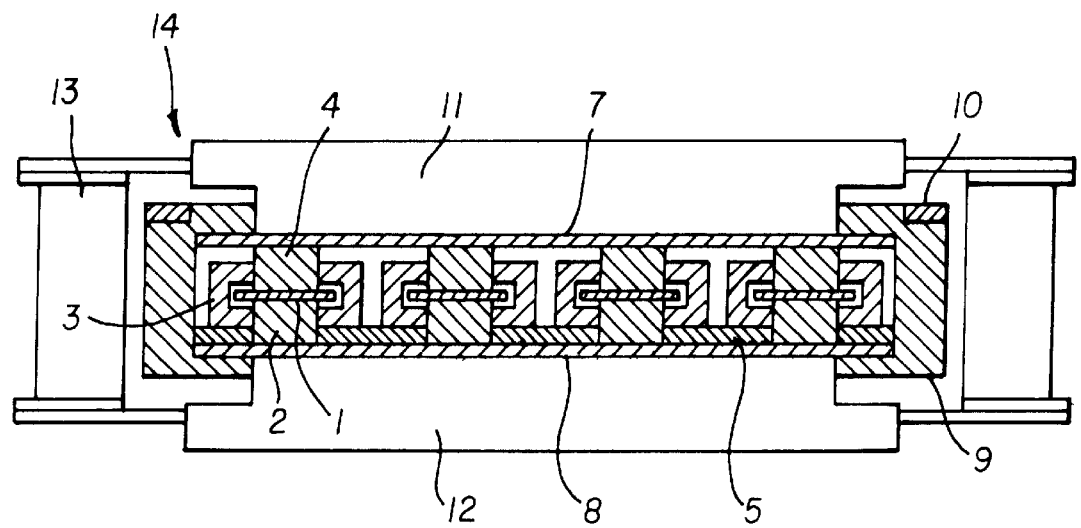
FIG. 1(A) is a cross-sectional view of a principal part of an IGBT according to the first embodiment of the present invention, and FIG. 1 (B) is a plan view showing a positioning frame used in the IGBT of the first embodiment.
Figure 1B:
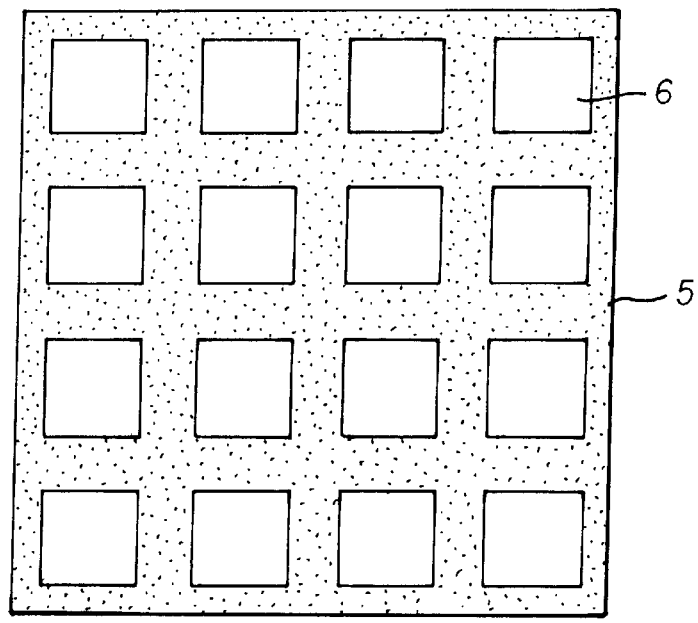

FIG. 1(A) is a cross-sectional view of a principal part of an IGBT according to the first embodiment of the present invention, and FIG. 1(B) is a plan view of a positioning frame used in the IGBT of FIG. 1(A). As shown in FIG. 1(A), a plurality of IGBT chips 1 are respectively soldered to individual collector substrates 2 each serving as a support plate and made of molybdenum having a coefficient of thermal expansion close to that of silicon, such that each collector substrate 2 is in contact with a surface of a collector electrode as a second main electrode provided on a second main surface of the corresponding IGBT chip 1. Thus, the IGBT chip 1 and the collector substrate 2 constitute a semiconductor element. An emitter contact terminal block 4 also made of molybdenum is accurately positioned by an insulating positioning guide 3, on a surface of an emitter electrode as a first main electrode provided on a first main surface of the corresponding IGBT chip 1. Thus, the IGBT chip 1, collector substrate 2, and the emitter contact terminal block 4 constitute an individual semiconductor unit. A single positioning frame 5 as shown in FIG. 1(B) has a plurality of openings 6 formed at the locations of the individual semiconductor units. The semiconductor units are respectively fitted in the openings 6 of the positioning frame 5, so that the units are positioned in horizontal directions while being spaced from each other at predetermined intervals, as shown in FIG. 1(A). The plural semiconductor units thus positioned in the horizontal directions by the positioning frame 5 are sandwiched between upper thin plate 7 and lower thin plate 8 that serve as lids, and the outer peripheral portions of the upper and lower thin plates 7, 8 are supported by an insulating outer frame 9 so that the assembly of the semiconductor units is appropriately positioned in the vertical and horizontal directions. A gate liner 10 is provided in the outer peripheral portion of the insulating outer frame 9, such that the gate liner 10 is connected to a gate electrode as a control electrode located beside the first main electrode on the first main surface of each IGBT chip 1. The assembly of the semiconductor units is accurately positioned by the insulating outer frame 9, and placed within a flat package 14 that consists of upper common electrode plate 11 and lower common electrode plate 12 that are made of copper, and an insulating sleeve 13 made of a ceramic material and disposed between the upper and lower electrode plates 11, 12. In this manner, an IGBT having a flat structure is provided. Here, the collector substrate 2 and emitter contact terminal block 4 apply pressures to the corresponding IGBT chip 1, and function to electrically connect the main electrodes of the IGBT chip 1 with the upper and lower thin plates 7, 8 while permitting heat dissipation.

In FIG. 1, the positioning guides 3 and the insulating outer frame 9 are illustrated as if each of these members were formed as an integral body, for the sake of simplification. The positioning guide 3, however, is actually divided into a lower portion that houses the IGBT chip 1 and the collector substrate 2, and an upper portion that positions the emitter contact terminal block 4. The insulating outer frame 9 is also divided into a lower portion that houses the lower thin plate 8, positioning frame 5, semiconductor units, and the upper thin plate 7, and an upper portion that presses the outer peripheral portion of the upper thin plate 7 from the above.

The positioning frame 5 is formed of a material (copper in this embodiment) whose coefficient of thermal expansion is equivalent to that of the upper and lower common electrode plates 11, 12, and the upper thin plate 7 and the lower thing plate 8 are formed of a material (copper in this embodiment) whose coefficient of thermal expansion is also equivalent to that of the upper and lower electrode plates 11, 12. The insulating outer frame 9 is made of a plastic having a high heat resistance.

In the present embodiment, the positioning frame 5 has sixteen openings 6 that receive sixteen semiconductor elements, as shown in FIG. 1(B). The semiconductor elements include four flywheel diodes (that do not have control terminals) which are received in four openings 6 located in the inner part of the frame 5, and twelve IGBT and flywheel diodes as needed, which are received in twelve openings 6 located in the peripheral part of the frame 5 and surrounding the above four openings 6. In this case, the flywheel diodes are oriented such that the anode of each diode contacts with the corresponding emitter contact terminal block 4. The gate electrodes of the IGBT chips are connected to the gate liner 10 provided on the insulating outer frame 9.

In fabrication of the IGBT as described above, a solder sheet is sandwiched between the IGBT chip 1 and collector substrate 2 of each semiconductor element, and the corresponding emitter contact terminal block 4 is guided and positioned by the positioning guide 3. In this state, a pressure soldering apparatus applies a pressure to the semiconductor units each consisting of the IGBT chip 1, collector substrate 2, and the emitter contact terminal block 4, and heat them so that the IGBT chips 1 are secured to the corresponding collector substrates 2. The pressure soldering apparatus is provided with a stopper that serves to limit the stroke or moving distance of a pressurizing member to a predetermined value, thereby to adjust the height of the semiconductor units at the same time.

In a power cycle test, current is repeatedly caused to flow through a load at certain time intervals while a pressure is applied to the upper common electrode plate 11 and the lower common electrode plate 12, and the resistance to power cycles is evaluated based on the number of cycles counted until the service life of the IGBT expires due to temperature cycles caused by the intermittent current flow through the load.

As described above, each set of the IGBT chip 1, collector substrate 2, positioning guide 3 and the emitter contact terminal block 4 are assembled into a semiconductor unit, and the positioning of the individual units in horizontal directions is accomplished by the positioning frame 5 that does not cause thermal stresses. Further, the positioning of the semiconductor units in the vertical direction is accomplished by the upper thin plate 7 and lower thin plate 8 that do not cause thermal stresses, like the positioning frame 5. Thus, the plural IGBT chips are arranged in rows and columns between the opposite common electrode plates having large areas. With this arrangement, even where the temperature changes cyclically in a power cycle test, the individual chips are allowed to move in accordance with thermal expansion of the common electrodes, and therefore thermal stresses from the common electrode plates can be prevented, particularly for the chips located in the peripheral portion of the device. The resulting pressure contact type semiconductor device exhibits a high operating reliability.

While the same material, i.e., copper, is used for forming the positioning frame 5 and the upper and lower common electrode plates 11, 12 in the present embodiment, other materials may be employed provided that these frame and electrode plates 5, 11, 12 have substantially the same coefficient of thermal expansion. TABLE 1 below shows some materials that can be used for the positioning frame 5.

TABLE 1

| Material | Coefficient of Linear Expansion ($10^{-6}$ $K^{-1}$) |
| --- | --- |
| Copper | 17.1 |
| Silver | 19.6 |
| SUS 304 | 17.3 |
| SUS 316 | 16.0 |
| Glass-filled polyimide resin (filling rate 30%) | 20.0 |
| Glass-filled polyimide resin (filling rate 40%) | 14.0 |

As shown in TABLE 1 above, copper has a coefficient of linear expansion of $17.1 \times 10^{-6}$ $K^{-1}$ and materials having equivalent coefficients of linear expansion include silver, stainless steel (SUS 304, SUS 316), and heat resistant plastics. In addition, copper alloys and silver alloys whose coefficients of linear expansion are equivalent to that of copper may also be used. Examples of heat resistance plastics include glass-filled polyimide resins (filling rate: 30%, 40%) whose coefficients of linear expansion are equivalent to that of copper.

While copper is used for the upper thin plate 7 and lower thin plate 8 in the present embodiment, the materials as indicated in TABLE 1, except the heat resistant plastics, may be used since the thin plates 7, 8 are required to show electric conductivity, as well as having a coefficient of linear expansion that is equivalent to that of the upper and lower common electrode plates 11, 12.

Figure 2A:
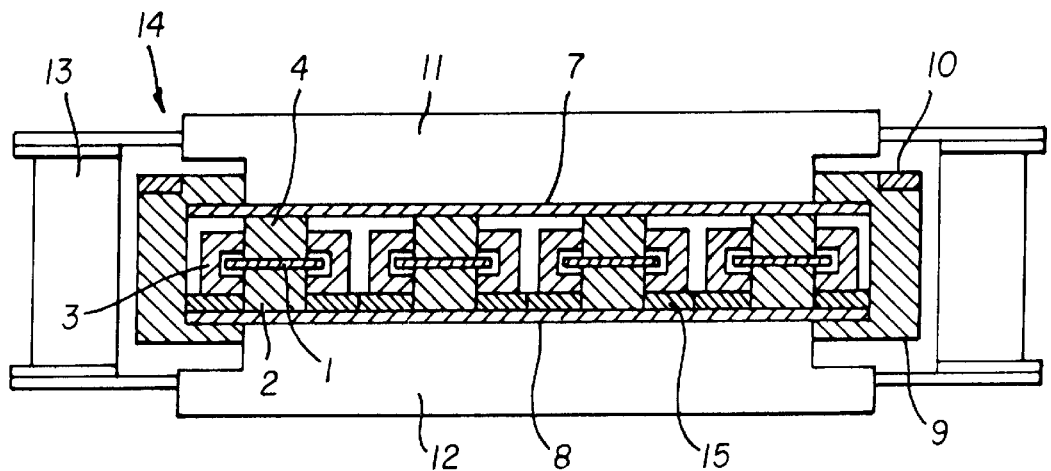
FIG. 2(A) is a cross-sectional view of a principal part of an IGBT according to the second embodiment of the present invention.
Figure 2B:
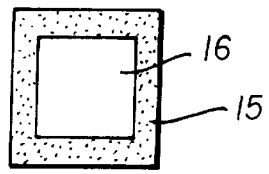
FIG. 2(B) is a plan view showing a positioning frame used in the IGBT of the second embodiment.

FIG. 2(A) is a cross-sectional view showing a principal part of IGBT according to the second embodiment of the present invention, and FIG. 2(B) is a plan view of a positioning frame used in the IGBT. In FIG. 2(A) and 2(B), the same reference numerals as used in FIG. 1 are used for identifying corresponding elements, of which no detailed description will be provided herein. In the second embodiment, an individual positioning frame 15 made of copper as used for the upper common electrode plate 11 and lower common electrode plate 12 is disposed around each collector substrate 2, and adjacent faces of the individual positioning frames 15 are brought into contact with each other, so that the individual semiconductor elements are accurately positioned in horizontal directions. Each of the positioning frames 15 is formed at its middle portion with an opening 16 in which the corresponding collector substrate 2 is inserted, as shown in FIG. 2(B).

The positioning frames 15 provided for the respective semiconductor elements are disposed on the lower thin plate 8 within the insulating outer frame 9 such that the outer faces of the adjacent positioning frames 15 are held in contact with each other, so as to yield the same effect as provided in the first embodiment in which a single positioning frame 5 is used. The positioning frames 15 of the present embodiment may be used in common for different types of semiconductor devices. Where IGBTs having different numbers of chips are fabricated, for example, there is no need to prepare a plurality of types of positioning frames having different numbers of openings depending upon the number of chips mounted in the device.

Figure 3A:
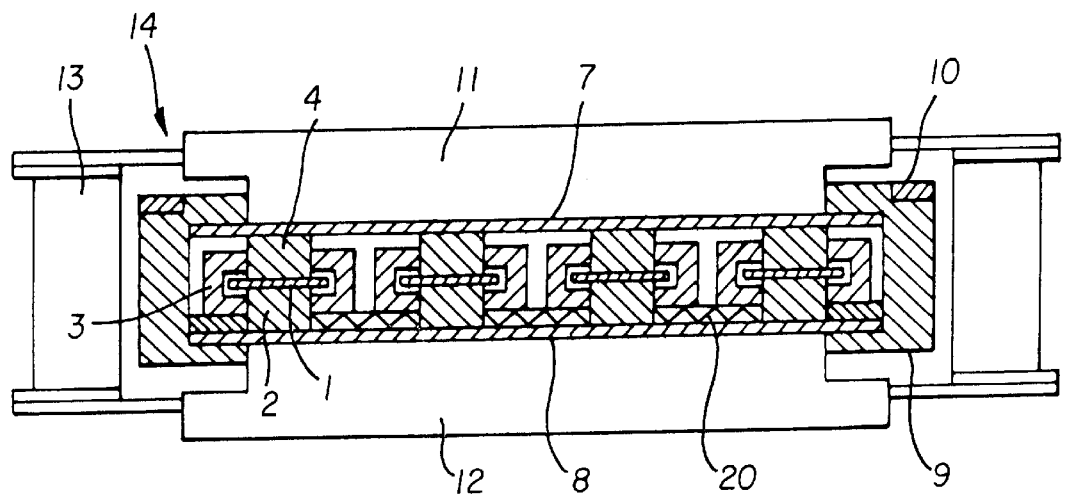
FIG. 3(A) is a cross sectional view of a principal part of an IGBT according to the third embodiment of the present invention.
Figure 3B:
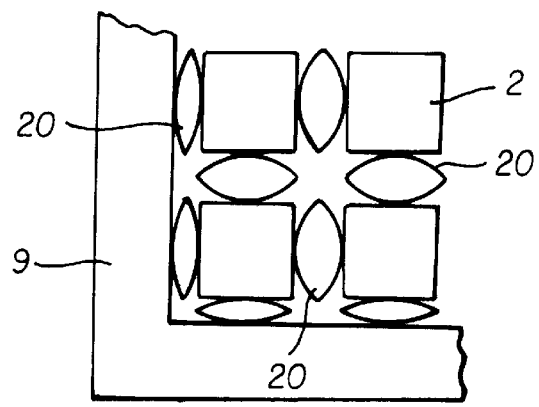
FIG. 3(B) is a plan view showing positioning springs mounted in the IGBT of the third embodiment.
Figure 4:
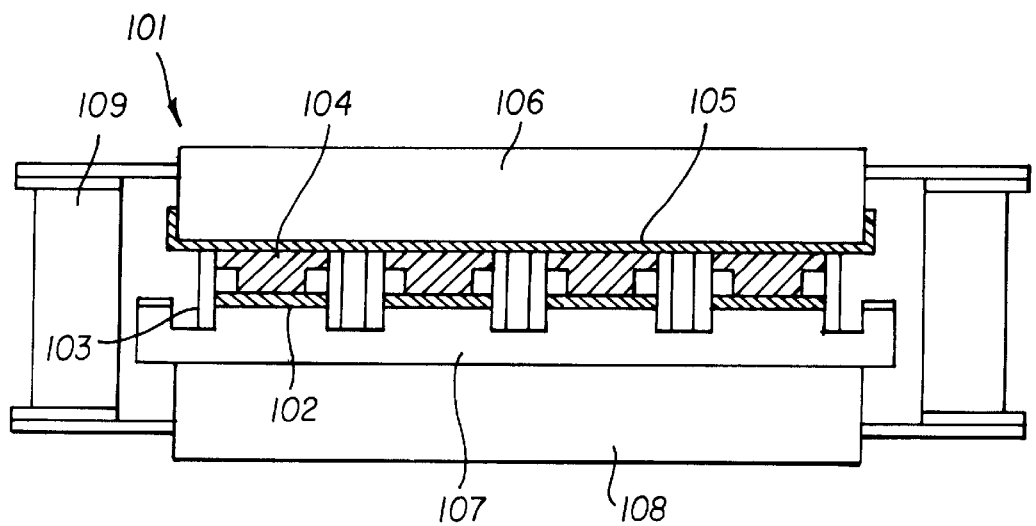
FIG. 4 is a view showing a cross section of a principal part of a known IGBT having a flat structure.
Figure 5:
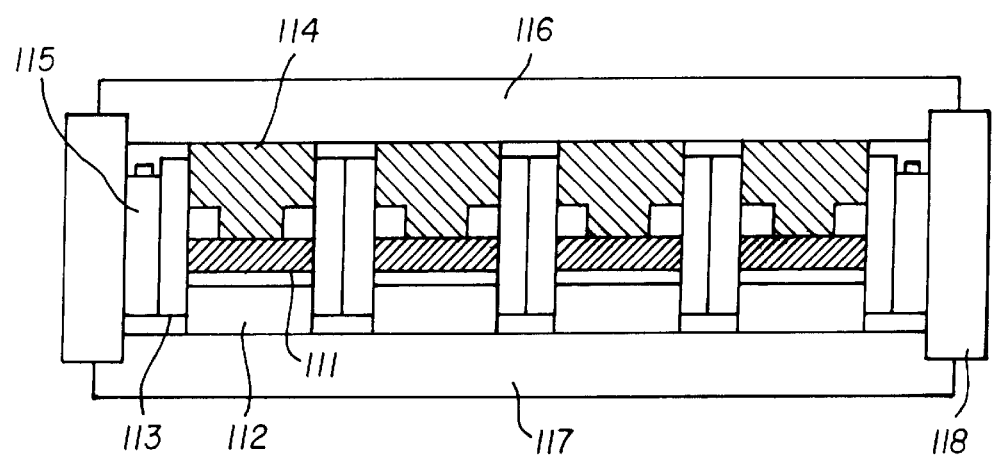
FIG. 5 is a view showing a cross section of a principal part of another known IGBT having a flat structure.

FIG. 3(A) is a cross-sectional view showing a principal part of an IGBT according to the third embodiment of the present invention, and FIG. 3(B) is a plan view showing a part of the IGBT in which positioning springs are mounted. In FIGS. 3(A) and 3(B), the same reference numerals as used in FIG. 1 are used for identifying corresponding elements, of which no detailed description will be provided. In the third embodiment, positioning springs 20 are inserted between adjacent collector substrates 2, and between the outermost collector substrates 2 and the inner wall of the insulating outer frame 9, so as to position the individual semiconductor elements in horizontal directions. Each of the positioning springs 20 consists of two arc-shaped sheet springs that are bonded to each other at their opposite ends. The positioning springs 20 are inserted between the adjacent collector substrates 2, and between the collector substrates and the inner wall of the insulating outer frame 9, while a pressure is being applied to each positioning spring 20 in the direction of its thickness to thus deform the spring 20. As a result, the positioning of the individual semiconductor elements in the horizontal directions is accomplished when the spring forces of the positioning springs 20 are balanced.

While some preferred embodiments of the present invention have been described above, the present invention is not limited to these particular embodiments. Although copper is used for forming the positioning frames 5, 15 so as to provide substantially the same coefficient of thermal expansion as that of the upper common electrode plate 11 and lower common electrode plate 12, the positioning frames 5, 15 may also be made of a material, such as silicone rubber, that has a relatively small modulus of elasticity. With a decrease in the modulus of elasticity, the force due to a difference in the coefficients of thermal expansion is less likely to be produced even if the material has a relatively large coefficient of thermal expansion, and therefore thermal stresses can be alleviated or reduced. While sixteen semiconductor chips are mounted in the same flat package in the illustrated embodiments, the number of semiconductor chips may be changed as desired depending upon the required current capacity. Further, the semiconductor chips used in the present invention are not limited to IGBT chips as illustrated above, but may be other types of semiconductor chips, such as MOS control thyristors, and MOS transistors.

According to the present invention as described above, a plurality of semiconductor chips, such as IGBT and flywheel diodes, are mounted in a flat package, such that each of the semiconductor chips is secured to a collector substrate provided for each chip, and an emitter contact terminal block is positioned relative to the corresponding semiconductor chip and collector substrate by means of a positioning guide, to thus provide an individual semiconductor unit. A plurality of semiconductor units each consisting of the semiconductor chip, collector substrate, and the emitter contact terminal block are positioned in horizontal directions, using a positioning frame(s) that does not produce thermal stresses, and interposed between thin plates that do not produce thermal stresses like the positioning frame(s), so as to be positioned in the vertical direction. With this arrangement, the individual chips are allowed to move in accordance with thermal expansion of common electrode plates when the temperature changes cyclically in a power cycle test, for example, thereby to avoid large thermal stresses applied from the common electrode plates to the chips, particularly those in the peripheral portion of the semiconductor device. Thus, the pressure contact type semiconductor device of the present invention exhibits high resistance to power cycles, and a high operating reliability. Also, the above arrangement permits the use of common electrodes having larger areas than conventional ones, and the number of semiconductor chips mounted in the same package can be accordingly increased, so as to provide an IGBT of a flat structure having a significantly increased current capacity.

What is claimed is:

1. A semiconductor device comprising:
    a plurality of semiconductor units each of which includes a semiconductor element, a contact terminal block, and a positioning guide, said semiconductor element comprising a semiconductor chip and a support plate, said semiconductor chip including a first main electrode and a control electrode disposed on a first main surface thereof, and a second main electrode disposed on a second main surface thereof, said support plate being secured to a surface of said second main electrode for applying a pressure to the semiconductor chip and serving as a conductor and a heat radiator, said contact terminal block being disposed on a surface of said first main electrode of said semiconductor chip, for applying a pressure to the semiconductor chip and serving as a conductor and a heat radiator, said positioning guide positioning said support plate and said contact terminal block on the surface of said first main electrode;
    a flat package comprising first and second common electrode plates and an insulating outer sleeve that surrounds the first and second common electrode plates, said flat package incorporating therein said plurality of semiconductor units that are arranged side by side, said first and second common electrode plates being in pressure contact with the contact terminal blocks and the support plates, respectively, of all of said semiconductor units; and positioning and thermal-stress reducing means for positioning the support plates of the semiconductor elements in a horizontal direction, without interfering with the positioning guides, and reducing a thermal stress applied to a peripheral portion of a contact interface between the contact terminal block and the semiconductor chip due to heat generated during intermittent flow of current through a load.

2. A semiconductor device according to claim 1, wherein said positioning and thermal-stress reducing means comprises a single positioning frame made of a material whose coefficient of thermal expansion is equivalent to that of said first and second common electrode plates, said positioning frame including a plurality of openings that receive the support plates of the respective semiconductor elements of the semiconductor units that are arranged side by side.

3. A semiconductor device according to claim 1, wherein said positioning and thermal-stress reducing means comprises a plurality of positioning frames provided for the respective semiconductor units and made of a material whose coefficient of thermal expansion is equivalent to that of said first and second common electrode plates, each of said plurality of positioning frames being disposed around the support plate of the semiconductor element of each of said semiconductor units, said positioning frames being arranged in contact with each other in a horizontal direction.

4. A semiconductor device according to claim 2, wherein said positioning and thermal-stress reducing means comprises a material selected from the group consisting of copper, silver, copper alloys, silver alloys, stainless steel, and heat-resistance plastics.

5. A semiconductor device according to claim 1, wherein said positioning and thermal-stress reducing means comprises a single positioning frame made of a material having a small modulus of elasticity, said positioning frame including a plurality of openings that receive the support plates of the respective semiconductor elements of the semiconductor units that are arranged side by side.

6. A semiconductor device according to claim 1, wherein said positioning and thermal-stress reducing means comprises a plurality of positioning frames provided for the respective semiconductor units and made of a material having a small modulus of elasticity, each of said plurality of positioning frames being disposed around the support plate of the semiconductor element of each of said semiconductor units, said positioning frames being arranged in contact with each other in a horizontal direction.

7. A semiconductor device according to claim 5, wherein said positioning and thermal-stress reducing means comprises silicone rubber.

8. A semiconductor device according to claim 1, wherein said positioning and thermal-stress reducing means comprises a plurality of positioning springs disposed around the support plates of the semiconductor elements of the semiconductor units that are arranged side by side, for positioning the support plates in a horizontal direction.

9. A semiconductor device according to claim 1, further comprising first and second thin plates disposed on upper and lower sides, respectively, of said plurality of semiconductor units that are positioned in the horizontal direction, said thin plates being made of a conductive material whose coefficient of thermal expansion is equivalent to that of said first and second common electrode plates; and an insulating outer frame that sandwiches outer peripheral portions of said first and second thin plates so as to form an assembly of the semiconductor units that are positioned in vertical direction and horizontal direction, said insulating outer frame being positioned within said flat package comprising said first and second common electrode plates and said insulating outer sleeve, said first and second common electrode plates being in pressure contact with the contact terminal blocks and the support plates of all of said semiconductor units, said insulating outer frame including a liner that is connected to said control electrode of said semiconductor chip.

10. A semiconductor device according to claim 9, wherein said first and second thin plates comprise a material selected from the group consisting of copper, silver, copper alloys, silver alloys, and stainless steel, and wherein said insulating outer frame comprises a heat-resistance plastic.

11. A semiconductor device according to claim 1, wherein said semiconductor chip including the first main electrode and the control electrode disposed on the first main surface, and the second main electrode disposed on the second main surface is selected from the group consisting of an insulated gate bipolar transistor, a MOS control thyristor, and a MOS transistor, and wherein said flat package further incorporates at least one flywheel diode in addition to said plurality of semiconductor chips.

12. A semiconductor device according to claim 3, wherein said positioning and thermal-stress reducing means comprises a material selected from the group consisting of copper, silver, copper alloys, silver alloys, stainless steel, and heat-resistance plastics.

13. A semiconductor device according to claim 6, wherein said positioning and thermal-stress reducing means comprises silicone rubber.

* * * * *